(12) United States Patent
Sun et al.

(10) Patent No.: US 11,280,674 B1
(45) Date of Patent: Mar. 22, 2022

(54) DIFFERENTIAL TRANS-IMPEDANCE AMPLIFIER RECEIVER USING COUNTER-OFFSET CIRCUITRY

(71) Applicant: VEO PHOTONICS, INC., San Diego, CA (US)

(72) Inventors: Chen-Kuo Sun, Escondido, CA (US); Jeb M. Binkley, Portland, OR (US); Robert B. Welstand, San Diego, CA (US)

(73) Assignee: VEO, San Diego, CA (US)

( * ) Notice: Subject to any disclaimer, the term of this patent is extended or adjusted under 35 U.S.C. 154(b) by 0 days.

(21) Appl. No.: 17/149,469

(22) Filed: Jan. 14, 2021

Related U.S. Application Data

(63) Continuation-in-part of application No. 17/031,429, filed on Sep. 24, 2020.

(51) Int. Cl.
*G01J 1/46* (2006.01)
*H03F 3/45* (2006.01)
*G01J 1/44* (2006.01)

(52) U.S. Cl.
CPC ............ *G01J 1/46* (2013.01); *H03F 3/45475* (2013.01); *G01J 2001/446* (2013.01); *H03F 2200/375* (2013.01)

(58) Field of Classification Search
CPC ... G01J 1/46; G01J 2001/446; H03F 3/45475; H03F 2200/375
See application file for complete search history.

(56) References Cited

U.S. PATENT DOCUMENTS

| | | | |
|---|---|---|---|
| 4,498,001 A | 2/1985 | Smoot | |
| 7,148,458 B2 * | 12/2006 | Schell | H03F 3/087 250/203.3 |
| 7,368,999 B2 | 5/2008 | Natzke | |
| 10,498,461 B1 | 12/2019 | Vera Villarroel | |
| 10,819,425 B2 * | 10/2020 | Tanaka | H03F 1/34 |

* cited by examiner

*Primary Examiner* — Seung C Sohn
(74) *Attorney, Agent, or Firm* — Insigne PC (57) ABSTRACT

A system for converting an optical signal into an electrical signal includes at least one differential Trans-Impedance Amplifier (TIA). To minimize (preferably eliminate) DC offset issues at the TIA output, an Input Counter-Offset (ICO) circuit is provided to remove the DC component of the initial optical signal from the input to the TIA. To further maximize the removal of DC offset at the TIA output, an Output Counter-Offset circuit is provided to take DC offset from the TIA output for use as a negative feedback directly to the input of the TIA. Modifications of the present invention are also intended for use with two TIA terminations and with a travelling wave photodiode.

20 Claims, 8 Drawing Sheets

DIFFERENTIAL TRANS-IMPEDANCE AMPLIFIER RECEIVER USING COUNTER-OFFSET CIRCUITRY

This application is a continuation-in-part of application Ser. No. 17/031,429, filed Sep. 24, 2020, which is currently pending. The contents of application Ser. No. 17/031,429 are incorporated herein by reference.

FIELD OF THE INVENTION

The present invention pertains generally to systems for converting optical signals into electrical signals. More particularly, the present invention pertains to electro-optical systems that employ input and output counter-offset circuits to minimize noise and interference issues encountered during operations of a differential Trans-Impedance Amplifier (TIA). The present invention is particularly, but not exclusively, useful for providing DC offset values from the output of a TIA as feedback for cancelling DC offset issues at the input of the TIA.

BACKGROUND OF THE INVENTION

It is well known that the photocurrent generated by a photodiode in response to a modulated optical signal will include both an AC portion, $I_{pd}(AC)$, and a DC portion, $I_{pd}(DC)$. It is also known that the AC portion $I_{pd}(AC)$ of this photocurrent contains all of the information contained in the modulated optical signal. The consequence of this is that only the AC portion $I_{pd}(AC)$ is actually needed for converting the optical signal into an electrical signal. It therefore follows that, for the signal processing purpose of converting an optical signal into an electrical signal, the DC portion $I_{pd}(DC)$ of the optical signal is superfluous and is sometimes detrimental.

For receiving and amplifying a photocurrent, Trans-Impedance Amplifiers (TIAs) are commonly used in modern optical receiver designs that employ a single photodiode. These DC-coupled TIAs, however, typically require feedback control from the TIA output to compensate for the DC offset that results when an averaged photocurrent is being received at the TIA input. This DC offset contributes to a condition commonly referred to as offset issues. Importantly, it is well known that when offset issues are present, the TIA's circuit bias conditions will vary with the offset current, depending on the optical signal strength; therefore, the performance and the dynamic operational range of the TIA are degraded.

The same considerations noted above are equally applicable, but more extensive, when differential Trans-Impedance Amplifiers (TIAs) are considered. Particularly, because each differential TIA has two input ports and two output ports, the DC offset issues deserve more scrutiny. For instance, considerations of using counter-offset signals as corrective feedback input for the differential TIA are relevant.

In light of the above, it is an object of the present invention to provide counter-offset circuits that compensate for the photocurrent DC offset issues. Yet another object of the present invention is to use input counter-offset circuits that incorporate single or multiple photodiodes with single or multiple TIAs in the optical receiver design. Still another object of the present invention is to provide input and output counter-offset circuitry that are easy to assemble, simple to use, and comparatively cost effective.

SUMMARY OF THE INVENTION

In overview, for a base configuration of the present invention the primary purpose is to provide only the AC portion $I_{pd}(AC)$ of a photocurrent that is generated by a photodiode as the input to a TIA, defined as an Input Counter-Offset (ICO) circuit. Stated differently, the objective is to counter a DC offset that changes the TIA input bias with respect to the DC portion $I_{pd}(DC)$. Moreover, in accordance with the present invention, this objective is accomplished using only components that are included in a circuit element that is interconnected entirely between the photodiode and the input port of the TIA.

The present invention recognizes that its purpose can be accomplished using either a current sensor or a voltage sensor in the circuit element. Further, the present invention recognizes that the connections between the photodiode and the TIA, via the circuit element, can be established to include either a current sensor or a voltage sensor in the circuit element. Further, the present invention recognizes that the connection between the input port of the TIA and the photodiode can be accomplished with either the cathode or the anode of the photodiode.

Consequently, there are four different embodiments for a base configuration of the present invention that accomplish the same result, i.e., a pure AC portion $I_{pd}(AC)$ input to the TIA. Two of these embodiments employ a current sensor where either the cathode or the anode of the photodiode is connected to the TIA input port. These embodiments employ a current mirror sensor wherein the photocurrent's DC portion $I_{pd}(DC)$ and its image cancel each other at the TIA input. The other embodiments of the present invention both employ a voltage sensor. For both of these embodiments a voltage deviation, $\Delta V$, at the TIA input, which is due to the DC portion $I_{pd}(DC)$ of the photocurrent, is identified by a feedback correction processor. The circuit element then responds to this $\Delta V$ change with a feedback cancellation current which can be added or subtracted to the photocurrent. Specifically, the feedback cancellation current is adjusted until the DC portion $I_{pd}(DC)$ in the photocurrent is suppressed and a pure AC portion $I_{pd}(AC)$ is present at the TIA input.

It is well known that differential Trans-impedance Amplifiers (TIAs) will increase the bandwidth of an opto-electric signal. They do so however, at the expense of increased DC offset issues. Consequently, various systems and methods to suppress these issues are disclosed here which include system configurations and methods that use at least one differential TIA. Also disclosed are system configurations and methods using single photodiodes or travelling wave photodiodes with at least two differential TIA terminals.

For systems that employ a differential TIA for converting an optical signal into an electrical signal, as disclosed above, a single photodiode that is responsive to an optical signal for generating a photocurrent having an AC component $I_{pd}(AC)$ and a DC component $I_{pd}(DC)$ can be used. In this case, however, a differential Trans-Impedance Amplifier (TIA) having a first input port and a second input port, as well as first and second DC outputs, is used. As before, a circuit element as disclosed above is used. With a differential TIA, however, the circuit element functions as an Input Counter-Offset (ICO) wherein the ICO output is received as an input to the "first" input port of the TIA. Typically, for this embodiment an Output Counter-Offset (OCO) circuit will also be used to help suppress the DC offset. Structurally, the OCO receives a differential DC output from the TIA to detect any DC offset. The DC offset in the TIA output is then employed as a negative feedback to the "second" input port of the TIA to cancel the output DC offset.

In detail, an OCO will include a pair of low pass filters for respectively receiving the first and second DC outputs from the TIA. The OCO will also include an Operational Amplifier (OPA) for receiving these DC outputs to quantify a voltage difference, ΔV, for the DC offset. In turn, this DC offset is used as a negative feedback to the "second" input port of the TIA to suppress DC offset at the input to the TIA.

Preferably, the Operational Amplifier (OPA) will have a differential output wherein a first OPA output is used as a negative feedback to the "second" input port of the TIA. In the same manner, the other OPA output can then be established as a negative feedback via the ICO to the "first" input port of the TIA. For this embodiment of the present invention the differential TIA will also provide a bias voltage for the ICO.

For an embodiment of the present invention which uses two differential TIAs, a photodiode is used that generates a photocurrent which splits into a first photocurrent and a second photocurrent. Each photocurrent will then have an AC component $I_{pd}(AC)$ and a DC component $I_{pd}(DC)$. In combination with the photodiode, a first differential Trans-Impedance Amplifier (TIA) receives the first photocurrent from the photodiode, and a second differential Trans-Impedance Amplifier (TIA) receives the second photocurrent from the photodiode.

Further, first and second Input Counter-Offset (ICO) circuits are used collectively to remove the DC component $I_{pd}(DC)$ from the first and second photocurrents to establish inputs for the first and second differential TIAs. Outputs from the first and second differential TIM are then fed to a differential summer to establish the electrical signal. Additionally, to cancel the respective DC offset issues for the first and second differential TIM, DC outputs from the first and second differential TIM are employed as disclosed above.

The present invention also envisions converting a traveling wave photocurrent into an electrical signal. For this embodiment a traveling wave photodiode which is responsive to an optical signal for generating a photocurrent splits into a first photocurrent and a second photocurrent. A first transmission line transmits the first photocurrent from the traveling wave diode to a first differential TIA, and a second transmission line transmits the second photocurrent from the traveling wave diode to a second differential TIA. Importantly, the characteristic impedance of the traveling wave photodiode is the same as those of the transmission impedance, and the input impedance of the differential TIM.

Like other embodiments of the present invention disclosed above, the respective DC offsets for the first and second TIM that receive signals from the traveling wave diode are suppressed by respective Input Counter-Offset (ICO) circuits.

For all embodiments of the present invention that involve at least one TIA, the output DC offset of the first differential TIA and the DC offset of the second differential TIA are caused by circuit unbalancing due to process-voltage-temperature variations in the TIA.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENTS

Figure 1:
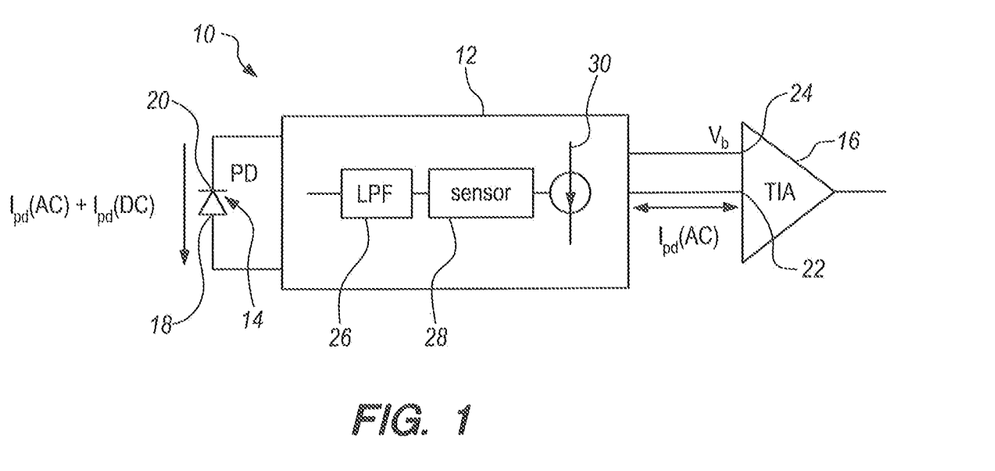
FIG. 1 is a schematic diagram of the general circuitry for the present invention.

Referring initially to FIG. 1, a circuitry in accordance with the present invention is shown and is generally designated 10. As shown, the circuitry 10 includes a circuit element 12 that is connected between a photodiode (PD) 14 and a Trans-Impedance Amplifier (TIA) 16. Also, as shown, the photodiode 14 has two nodes, an anode 18 and a cathode 20. Further, the TIA 16 includes an input port 22 and a diode bias port 24. In accordance with the present invention the anode 18 and the cathode 20 of the photodiode 14 are connected to the circuit element 12. Also, the input port 22 and the diode bias port 24 of the TIA 16 are connected to the circuit element 12.

Still referring to FIG. 1 it will be appreciated that the circuit element 12 includes a low pass filter (LPF) 26 and a sensor 28 that work together to control a current source 30. For purposes of the present invention, it is this current source 30 which outputs a cancellation current that cancels the unwanted offset issues that are mentioned above in the Background of the Invention, which would otherwise arise at the input port 22 of the TIA 16.

As disclosed in greater detail below, there are several embodiments for the present invention. Individually, these embodiments differ structurally from each other in two important respects. In one, the orientation of the anode 18 and cathode 20 of the photodiode 14 with the circuit element 12 can be reversed. In the other, the sensor 28 that is used for the circuit element 12 can be either a current sensor or a voltage sensor. Thus, there are essentially four different embodiments of the present invention (FIGS. 2A, 3A, 5 and 6, respectively).

Figure 2A:
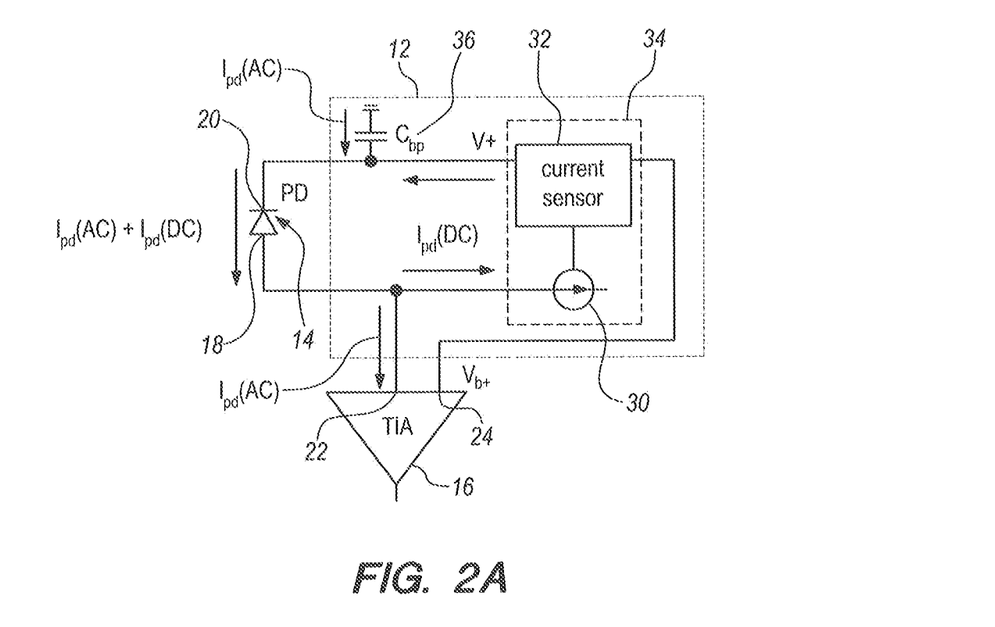
FIG. 2A is a schematic diagram showing components of the circuitry connected, in combination, with the input port and the diode bias port of the TIA, when the circuitry is configured with the anode of the diode connected to the input port of the TIA, and the circuitry includes a current sensor.
Figure 2B:
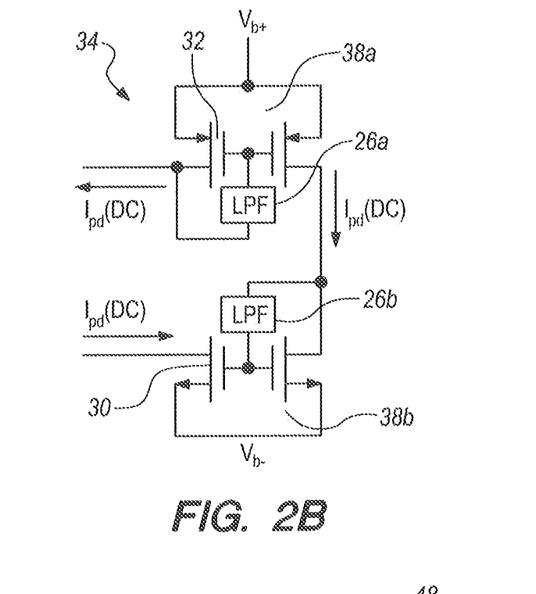
FIG. 2B is a schematic of a cancellation circuit having a current mirror sensor for the configuration of the circuitry shown in FIG. 2A.
Figure 2C:
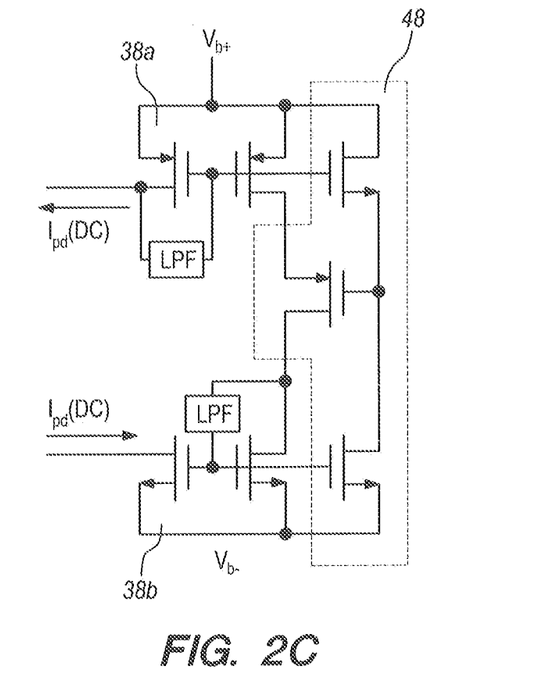
FIG. 2C is a schematic of a cancellation circuit, having a current mirror sensor and an auxiliary circuit to enhance the mirroring accuracy and stability, for the configuration of the circuitry shown in FIG. 2A.

FIG. 2A shows an embodiment of the circuit element 12 wherein the anode 18 of the photodiode 14 is connected to the input port 22 of the TIA 16 and the cathode 20 is connected to its diode bias port 24 through a current sensor 32. For the embodiment shown in FIG. 2A, a cancellation circuit 34 includes a current sensor 32 (the sensor 28 in FIG. 1) that interacts with a current source 30. Also, an AC bypass capacitor 36 is connected between the cathode 20 of the photodiode 14 and the current sensor 32. With reference to FIG. 2B it will be seen that the cancellation circuit 34 for this embodiment includes a first filtering mirror 38a that is biased by a voltage $V_{b+}$. In detail, the first filtering mirror 38a, having a current sensor 32 and a low pass filter 26a, is connected to the cathode 20 of the photodiode 14 with the AC bypass capacitor 36 connected therebetween. The second filtering mirror 38b, having a second low pass filter 26b and a current source 30, is then connected to the anode 18 of the photodiode 14, with the input port 22 of the TIA 16 connected therebetween. The function of AC bypass capacitor 36 is to direct an AC portion $I_{pd}(AC)$ of the photocurrent from cathode 20 to ground, and to direct a DC portion $I_{pd}(DC)$ of the photocurrent to go through the current sensor 32. Further rejection of the AC portion $I_{pd}(AC)$ in the current sensor 32 is accomplished with the low pass filter 26, e.g., connecting a resistor between the drain and the gate of a metal-oxide-semiconductor current sensor 32 together with a shunt capacitor connecting the sensor's gate to ground. In this invention, a low pass filter having a large RC time constant can be monolithically integrated with an ultra-low leakage metal-oxide gate. In a cooperation well known in the pertinent art, the current $I_{pd}(DC)$ (referring to FIGS. 2A and 2B) sensed by the first filtering mirror 38a will be imaged by the second filtering mirror 38b to thereby create a cancellation current which will cancel the DC portion $I_{pd}(DC)$ of the photocurrent prior to inputting the AC portion $I_{pd}(AC)$ into the TIA. The second low pass filter 26b in the second filtering mirror is used to reduce the current noise generated by the current source 30. An alternative cancellation circuit 34 can comprise an auxiliary circuit 48 between filtering mirrors 38a and 38b, as shown in FIG. 2C. This alternative cancellation circuit 34 is provided to improve the current mirroring accuracy and stability over a wide photocurrent operational range.

Figure 3A:
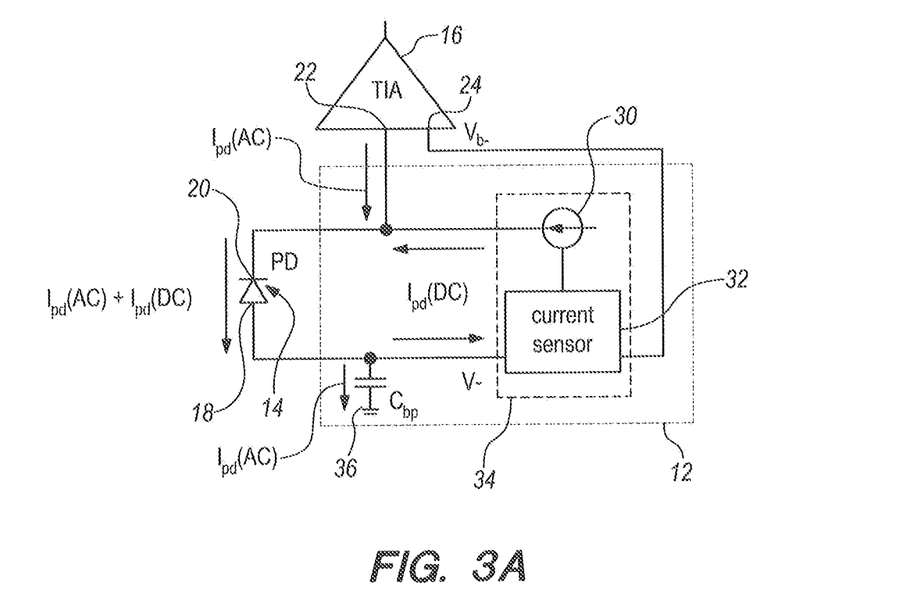
FIG. 3A is a schematic diagram showing components of the circuitry connected, in combination, with the input port and the diode bias port of the TIA, when the circuitry is configured with the cathode of the diode connected to the input port of the TIA, and the circuitry includes a current sensor.
Figure 3B:
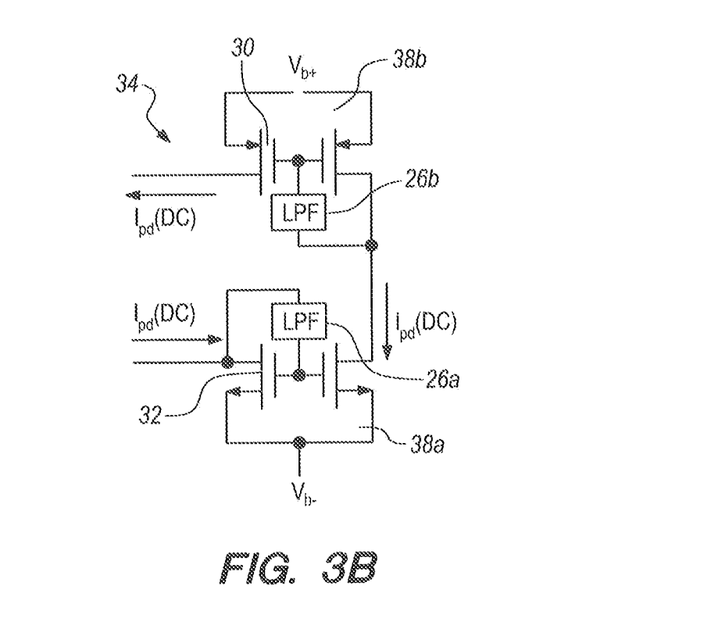
FIG. 3B is a schematic of a cancellation circuit having a current mirror sensor for the configuration of the circuitry shown in FIG. 3A.
Figure 3C:
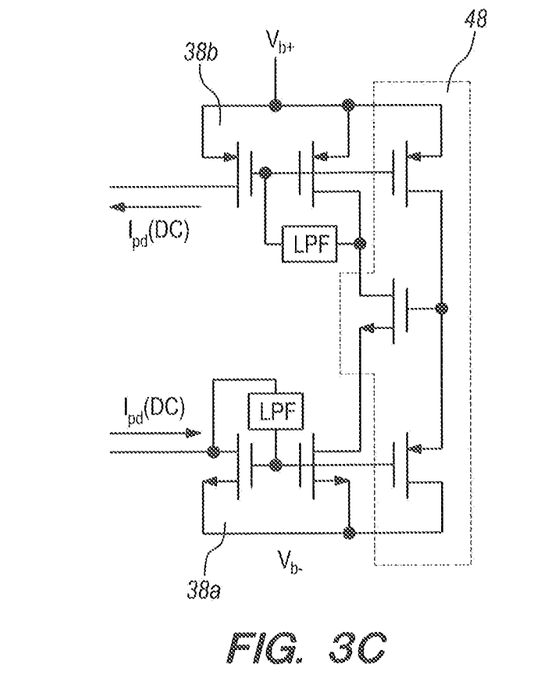
FIG. 3C is a schematic of a cancellation circuit, having a current mirror sensor and an auxiliary circuit to enhance the mirroring accuracy and stability, for the configuration of the circuitry shown in FIG. 3A.

As a generalized mirror image of the circuit element 12 shown in FIG. 2A, FIG. 3A shows an embodiment of the circuit element 12 wherein the cathode 20 of the photodiode 14 is connected to the input port 22 of the TIA 16, and the anode 18 is connected to the diode bias port 24 of the TIA 16. Again, the sensor 28 (in FIG. 1) is a current sensor 32 that interacts with a current source 30. In this embodiment, however, the AC bypass capacitor 36 is connected between the anode 18 of the photodiode 14 and the current sensor 32. Further, with reference to FIG. 3B it will be seen that the first filtering mirror 38a is biased by a voltage $V_{b-}$ and is connected to the anode 18 of the photodiode 14, with the AC bypass capacitor 36 connected therebetween. The second filtering mirror 38b is then connected to the cathode 20 of the photodiode 14 and is biased with a voltage $V_{b+}$ with the input port 22 of the TIA 16 connected therebetween. Thus, similar to the embodiment shown in FIG. 2A, the current $I_{pd}(DC)$ in the first filtering mirror 38a will be imaged by the second filtering mirror 38b to thereby create a cancellation current which will cancel the DC portion $I_{pd}(DC)$ in the photocurrent prior to inputting the AC portion $I_{pd}(AC)$ into the TIA. The current mirroring accuracy and stability, over a wide photocurrent operational range, can be improved with an alternative cancellation circuit 34 comprising an auxiliary circuit 48 between filtering mirrors 38a and 38b shown in FIG. 3C.

Figure 4:
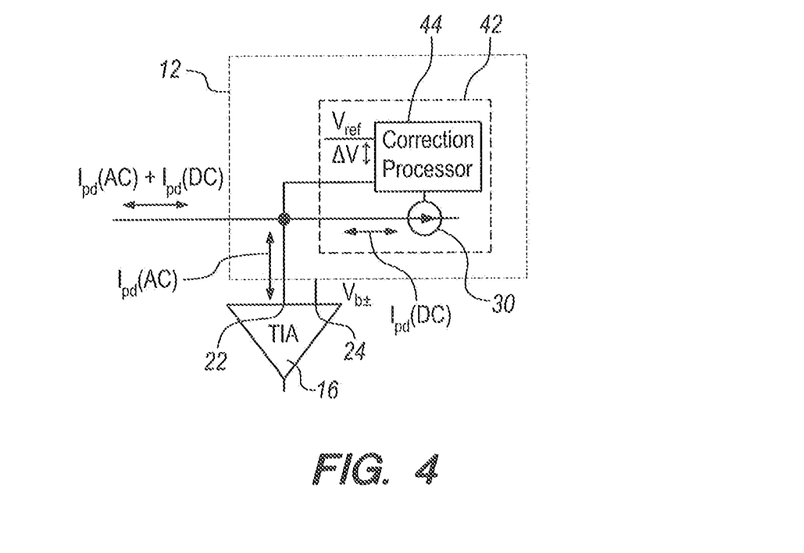
FIG. 4 is a schematic diagram of a representative feedback function for a current correction controller which is used when a voltage sensor is included in the circuit element of the present invention.

FIG. 4 shows a configuration for the present invention wherein voltage measurements function in combination with a current source 30. Further, for this configuration using a voltage sensor 40 (see FIG. 5), the circuit element 12 receives a bias voltage $V_{b\pm}$ from the diode bias port 24 of the TIA 16 that depends on the orientation to the anode 18 and the cathode 20 of the photodiode 14 with the circuit element 12.

Figure 5:
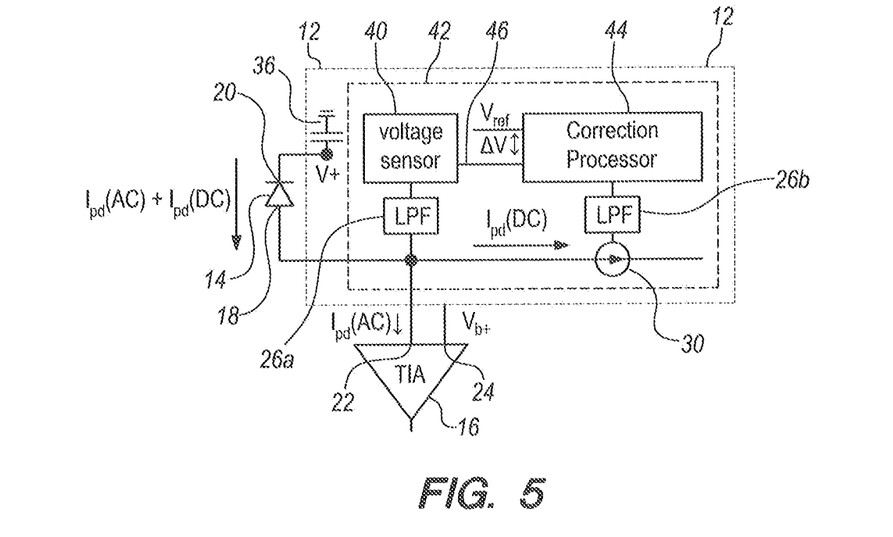
FIG. 5 is a schematic diagram of the present invention employing a voltage sensor when the anode of a photodiode is connected to the input port of a TIA.

As shown in FIG. 5, the anode 18 of the photodiode 14 is connected to the input port 22 of the TIA 16. On the other hand, the cathode 20 of the photodiode 14 is connected to an AC bypass capacitor 36. Further, the circuit element 12 is connected to the diode bias port 24 with a bias voltage $V_{b+}$. Within the cancellation circuit 42 of the circuit element 12, the voltage sensor 40 is connected to a correction processor 44. Further, the voltage sensor 40 is connected via a high impedance low pass filter 26a to the anode 18 of the photodiode 14 and also to the input port 22 of the TIA 16.

In combination, the voltage sensed by the voltage sensor 40 from the anode 18 of the photodiode 14 is provided as an output 46 that is sent to the correction processor 44, where a reference voltage, $V_{ref}$ is also received by the correction processor 44. In the correction processor 44, the difference between the output 46 from the voltage sensor 40 and the reference voltage $V_{ref}$ is identified as a differential $\Delta V$. This $\Delta V$ then generates a correction voltage, connected through a low pass filter 26b, for adjusting a cancellation current output from the current source 30. As in the other embodiments for the present invention, the resultant cancellation current is used for controlling any offset issues occurring at the input port 22 of the TIA 16.

Figure 6:
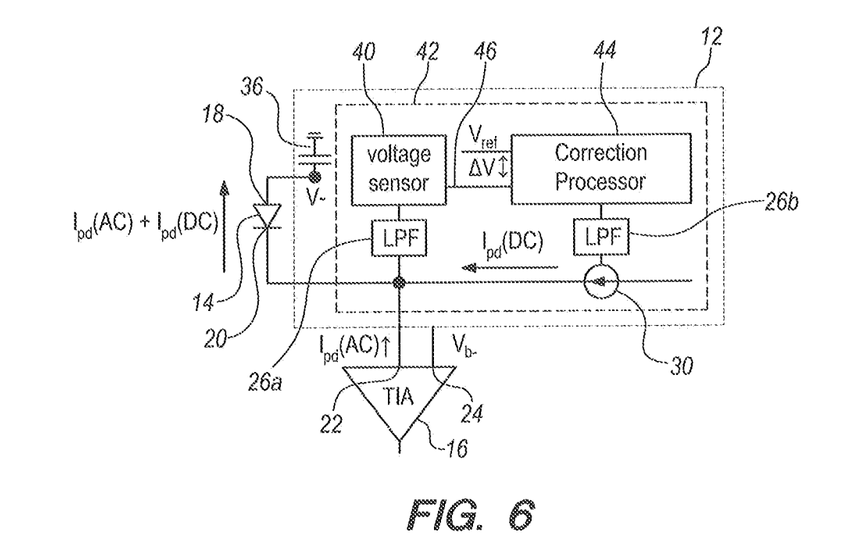
FIG. 6 is a schematic diagram of the present invention employing a voltage sensor when the cathode of a photodiode is connected to the input port of a TIA.

FIG. 6 shows a comparable configuration for a voltage sensor 40 version of the circuit element 12. In the configuration shown in FIG. 6, however, the cathode 20 of the photodiode 14 is connected to the input port 22 of the TIA 16, while the anode 18 of the photodiode 14 is connected to the AC bypass capacitor 36. Further, the circuit element 12 is connected to the diode bias port 24 with a bias voltage $V_{b-}$. In all other respects the embodiments of the present invention disclosed in FIGS. 5 and 6 function similarly.

In an operation of the present invention, the photodiode 14 generates a photocurrent in response to an optical signal. As a consequence, the photocurrent has an AC portion $I_{pd}(AC)$ and a DC portion $I_{pd}(DC)$. As noted above, the purpose of the present invention is to eliminate the DC portion $I_{pd}(DC)$ from the photocurrent as it enters the input port 22 of the TIA 16. As also noted above, this can be done in accordance with the operation of any one of four different configurations for a circuit element 12.

A simplified operation of the embodiments for the circuit element 12 shown in FIGS. 2A and 3A which use a current sensor 32, can be explained by considering the photocurrent $I_{pd}(AC)+I_{pd}(DC)$ that is generated by the photodiode 14. For these embodiments filtering mirrors 38a and 38b are used to create an image of the DC portion $I_{pd}(DC)$ of the photocurrent from one node of the diode 14. This image current is then fed back into the other node of the diode 14 to cancel (suppress) the DC portion $I_{pd}(DC)$ of the photocurrent prior to its input into the TIA.

Similarly, an operation of embodiments for the circuit element 12 shown in FIGS. 5 and 6 which use a voltage sensor 40, can be explained by again considering the photocurrent $I_{pd}(AC)+I_{pd}(DC)$ that is generated by the photodiode 14. For these embodiments, low pass filters 26a and 26b are used to isolate the voltage sensor 40 and the correction processor 44 from the AC portion $I_{pd}(AC)$ of the photocurrent. In this isolation, the output 46 of the voltage sensor 40 is compared with a reference voltage $V_{ref}$ to identify a differential voltage $\Delta V$. This differential voltage $\Delta V$ is then used to adjust a cancellation current until the DC portion $I_{pd}(DC)$ of the photocurrent is suppressed and only the AC portion $I_{pd}(AC)$ of the photocurrent is provided for input to the input port 22 of the TIA 16.

Figure 7:
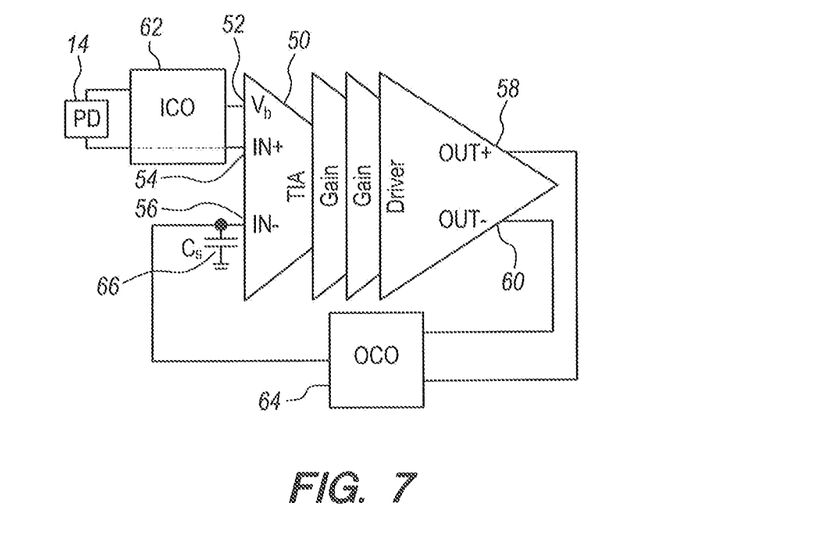
FIG. 7 is a schematic diagram of a differential TIA employing an Input Counter-Offset (ICO) circuit and an Output Counter-Offset (OCO) circuit for opto-electrical signals.

Prior disclosure has pertained generally to TIAs having a single input for a photocurrent and a single output for an electrical current. The use of a differential TIA 50 for a similar purpose is now disclosed. With reference to FIG. 7 it will be seen that a differential TIA has a bias port 52, a first input port 54, and a second input port 56. Also, in addition to gain amplifiers, the driver amplifier of differential TIA 50 has a first output port 58 and a second output port 60.

FIG. 7 also shows that the bias port 52 and first input port 54 of the differential TIA 50 are connected to an Input Counter-Offset (ICO) circuit 62 which, in turn, is connected to the photodiode 14. It is also important to note that the ICO 62 is essentially the same as the circuit element 12 disclosed above. FIG. 7 also shows that the output ports 58 and 60 of the differential TIA 50 are connected to an Output Counter-Offset (OCO) circuit 64. Importantly, the output of the OCO 64 is connected via a shunt capacitor 66 to the second input port 56 of the differential TIA 50.

Figure 8:
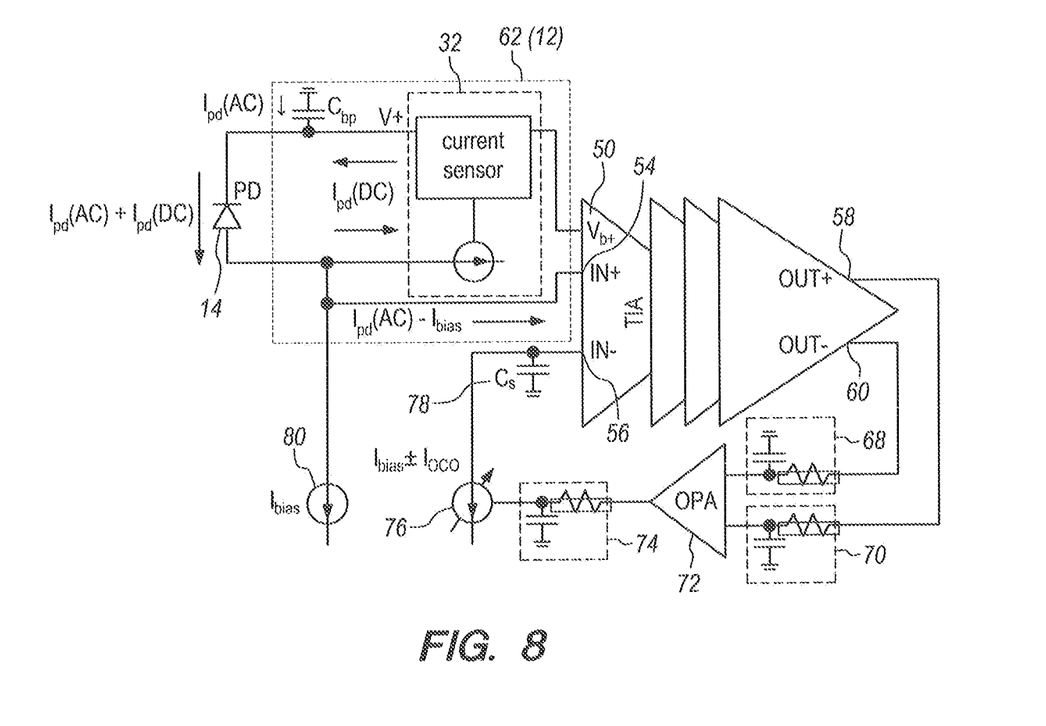
FIG. 8 is a schematic diagram of a differential TIA showing details of the ICO and OCO circuits referred to in FIG. 7.

Referring now to FIG. 8, it is seen that the first output port 58 of the differential TIA 50 is connected to a first low pass filter 68 and, likewise, the second output port 60 is connected to a second low pass filter 70. The low pass filters 68 and 70 are then connected with an Operational Amplifier (OPA) 72. Output from the OPA 72 is shown connected, in sequence, with a third low pass filter 74, a current source 76 and a shunt capacitor 78 before connecting with the second input port 56 of the differential TIA 50. In combination, the low pass filters 68 and 70, the Operational Amplifier (OPA) 72, the low pass filter 74, current source 76 and shunt capacitor 78 collectively constitute the Output Counter-Offset (OCO) 64 shown in FIG. 7. Thus, the OCO 64 provides a DC current $I_{bias} \pm I_{OCO}$, to the second input port 56 of the differential TIA 50, where $I_{bias}$ provides a TIA input bias current and loco is the output DC-offset compensation current.

Figure 9:
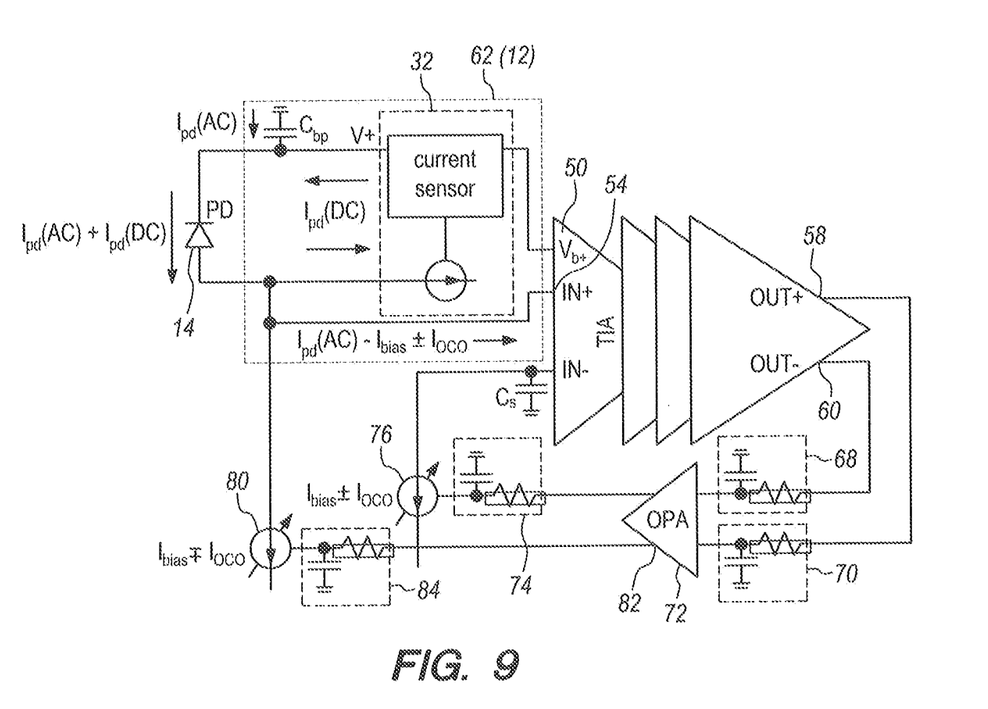
FIG. 9 is a schematic diagram of a differential TIA employing differential feedback elements.

In contrast with the circuitry shown in FIG. 8 for separate operations of the ICO 62 and OCO 64, FIG. 9 shows another embodiment of this circuitry wherein the ICO 62 and OCO 64 are combined. In detail, for this embodiment the OPA 72 has an additional differential output 82 which is connected via a fourth low pass filter 84 to the current source 80. The current source 80 then directs a combined bias $I_{bias}$ and OCO current $\mp I_{OCO}$ to the ICO 62. In the ICO 62, current from the current source 80 is combined with the AC component $I_{pd}(AC)$ from the photodiode 14 for feedback to the first input port 54 of the differential TIA 50. Thus, an additional counter-offset is provided for the first input of the differential TIA 50.

Figure 10:
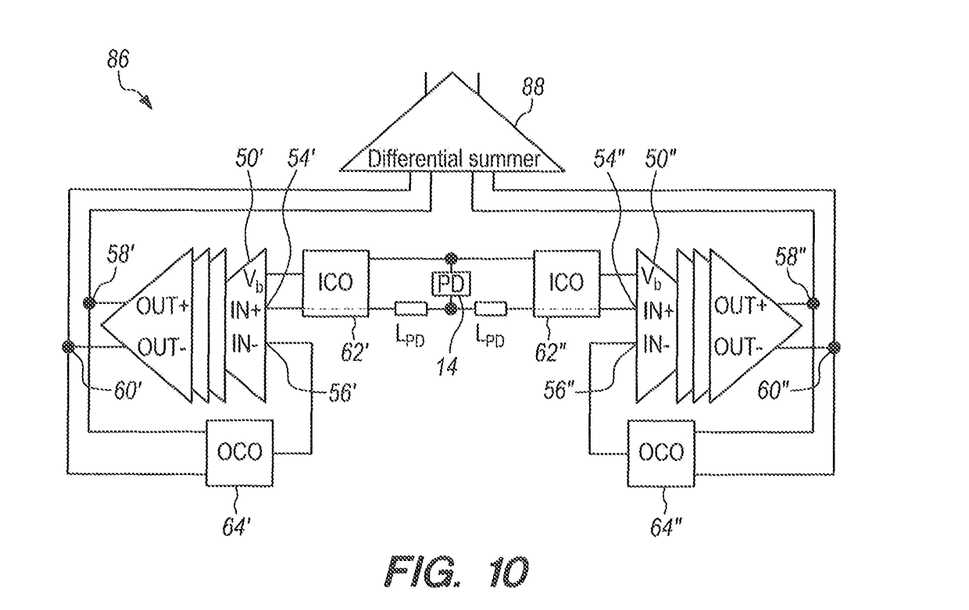
FIG. 10 is a schematic diagram of an optical receiver with two TIA terminations.

In FIG. 10 an embodiment for an optical receiver is shown and generally designated 86 which includes two differential TIAs 50' and 50" for the purpose of providing the optical receiver 86 with a broader bandwidth. Specifically, the photodiode 14 is connected to both an ICO 62' and an ICO 62". In this combination, the respective input ports 54' and 54" of the ICO 62' and the ICO 62" are each respectively connected to the differential TIA 50' or 50", to counter DC offset issues. Further, an OCO 64' interconnects the output ports 58' and 60' of the differential TIA 50' with its second input port 56'. Also, an OCO 64" interconnects the output ports 58" and 60" of the differential TIA 50" with its second input port 56". Thus, DC offset issues for both differential TIM 50' and 50" are suppressed while providing a collectively wider photo receiver bandwidth for the differential summer 88.

Figure 11:
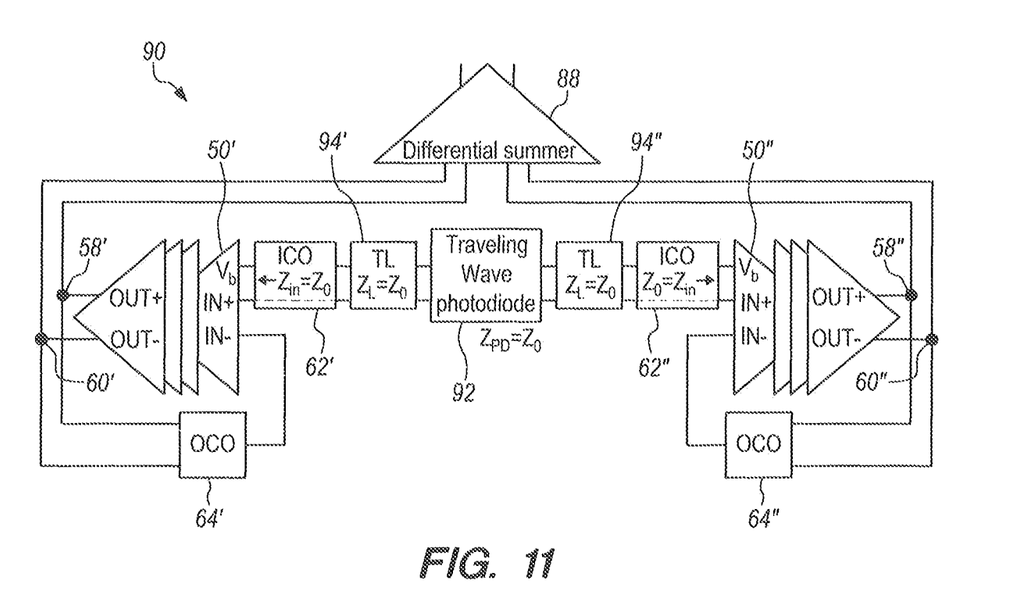
FIG. 11 is a schematic diagram of a travelling wave optical receiver with two TIA terminations.

FIG. 11 shows an optical receiver, generally designated 90, which addresses the issues involved when a pair of differential TIM 50' and 50" are connected with a traveling wave photodiode 92. As shown, a transmission line 94' interconnects the photodiode 92 with ICO 62' while another transmission line 94" interconnects the photodiode 92 with ICO 62". In this arrangement, a critical aspect of the optical receiver 90 is that there be an impedance match between the differential TIM 50' and 50". Stated differently when there is an impedance $Z_0$ for photodiode 92, the impedance of the transmission line 94' $Z_t$ must equal $Z_0$, and the impedance of the ICO 62' $Z_{in}$ must also equal $Z_0$. Likewise, the impedance of the transmission line 94' $Z_t$ must equal $Z_0$, and the impedance of the ICO 62" $Z_{in}$, must also equal $Z_0$. Stated differently, in both directions from the photodiode 92 there must be matching impedances: $Z_0=Z_t=Z_{in}$.

While the particular Differential Trans-Impedance Amplifier Receiver Using Counter-Offset Circuitry as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A system for converting an optical signal into an electrical signal which comprises:
   a photodiode responsive to an optical signal for generating a photocurrent having an AC component $I_{pd}(AC)$ and a DC component $I_{pd}(DC)$;
   an Input Counter-Offset (ICO) circuit for removing the DC component $I_{pd}(DC)$ from the photocurrent to establish an ICO output including the AC component $I_{pd}(AC)$;
   a differential Trans-impedance Amplifier (TIA) having a first input port and a second input port, wherein the ICO output is received as an input to the first input port of the TIA; and
   an Output Counter-Offset (OCO) circuit for receiving a differential DC output from the TIA to detect any DC offset therein, wherein any DC offset in the TIA output is employed as a negative feedback to the second input port of the TIA to cancel the output DC offset.

2. The system of claim 1 wherein the output DC offset is caused by circuit unbalancing due to process-voltage-temperature variations in the TIA.

3. The system of claim 1 further comprising an AC shunt capacitor located between the OCO and the second input port of the TIA to filter AC noise from the DC output of the TIA.

4. The system of claim 1 wherein the differential TIA has a first DC output and a second DC output, and wherein the OCO comprises:
   a first low pass filter for receiving the first DC output from the TIA;
   a second low pass filter for receiving the second DC output from the TIA; and
   an Operational Amplifier (OPA) for receiving the first DC output from the first low pass filter and the second DC output from the second low pass filter to quantify a voltage difference, $\Delta V$, for the DC offset to be used as a negative feedback to the second input port of the TIA to counter the output DC offset.

5. The system of claim 4 wherein the Operational Amplifier (OPA) has a differential output, and wherein a first OPA output is established with a negative feedback to the second input port of the TIA, and a second OPA output is established with a negative feedback via the ICO to the first input port of the TIA.

6. The system of claim 1 wherein the TIA provides a bias voltage for the ICO.

7. A system for converting an optical signal into an electrical signal having an improved broader bandwidth which comprises:
   a photodiode responsive to an optical signal for generating a photocurrent which splits into a first photocurrent having an AC component $I_{pd}(AC)$ and a DC component $I_{pd}(DC)$ and a second photocurrent having an AC component $I_{pd}(AC)$ and a DC component $I_{pd}(DC)$;
   a first differential Trans-impedance Amplifier (TIA) having a first input port for receiving the first photocurrent from the photodiode, and having a second input port, a first output port and a second output port;
   a second differential Trans-Impedance Amplifier (TIA) having a first input port for receiving the second photocurrent from the photodiode, and having a second input port, a first output port and a second output port;
   a first Input Counter-Offset (ICO) circuit for removing the DC component $I_{pd}(DC)$ from the first photocurrent to establish a first ICO output including its AC component $I_{pd}(AC)$ wherein the first ICO output is received as an input to the first input port of the first differential TIA;
   a second Input Counter-Offset (ICO) circuit for removing the DC component $I_{pd}(DC)$ from the second photocurrent to establish a second ICO output including its AC component $I_{pd}(AC)$ wherein the second ICO output is received as an input to the first input port of the second differential TIA; and
   a differential summer for receiving the output from the first DC-coupled output port of the first differential TIA and the output from the second DC-coupled output port of the first differential TIA, and for simultaneously receiving the output from the first DC-coupled output port of the second differential TIA and the output from the second DC-coupled output port of the second differential TIA to establish the electrical signal.

8. The system of claim 7 further comprising:
   a first Output Counter-Offset (OCO) circuit for receiving the first output and the second output from the first differential TIA to detect any DC offset therebetween, wherein any DC offset in the output of the first differential TIA is employed as a negative feedback to the second input port of the first differential TIA to cancel the output DC offset; and
   a second Output Counter-Offset (OCO) circuit for receiving the first output and the second output from the second differential TIA to detect any DC offset therebetween, wherein any DC offset in the output of the second differential TIA is employed as a negative feedback to the second input port of the second differential TIA to cancel the DC offset.

9. The system of claim 8 wherein the output DC offset of the first differential TIA and the DC offset of the second differential TIA are caused by circuit unbalancing due to process-voltage-temperature variations in the TIA.

10. The system of claim 8 further comprising:
    a first AC shunt capacitor located between the first OCO and the second input port of the first TIA to filter AC noise from the DC output of the first TIA; and
    a second AC shunt capacitor located between the second OCO and the second input port of the second TIA to filter AC noise from the DC output of the second TIA.

11. The system of claim 8 wherein the first and second differential TIAs respectively have a first DC output and a second DC output, and wherein the respective OCOs of the first and second differential TIAs each comprises:
    a first low pass filter for receiving the first DC output from the TIA;
    a second low pass filter for receiving the second DC output from the TIA; and
    an Operational Amplifier (OPA) for receiving the first DC output from the first low pass filter and the second DC output from the second low pass filter to quantify a voltage difference, $\Delta V$, for the DC offsets to be used as a negative feedback to the second input port of the respective TIA.

12. The system of claim 11 wherein the Operational Amplifier (OPA) of each TIA has a differential output, and wherein a first OPA output is established with a negative feedback to the second input port of the respective TIA, and a second OPA output is established with a negative feedback via the respective ICO to the first input port of the respective TIA.

13. The system of claim 7 wherein at least one differential TIA provides a photodiode bias voltage through the ICO.

14. The system of claim 7 further comprising:
    a first inductor positioned between the photodiode and the first input port of the first differential TIA; and
    a second inductor positioned between the photodiode and the first input port of the second differential TIA.

15. A system for converting a traveling wave photocurrent into an electrical signal which comprises:
    a traveling wave photodiode responsive to an optical signal for generating a photocurrent which splits into a first photocurrent and a second photocurrent;
    a first differential Trans-Impedance Amplifier (TIA) having a first input port for receiving the first photocurrent from the traveling wave photodiode, and having a second input port, a first DC output port and a second DC output port;
    a second differential Trans-Impedance Amplifier (TIA) having a first input port for receiving the second photocurrent from the traveling wave photodiode, and having a second input port, a first DC output port and a second DC output port;

a first transmission line for transmitting the first photocurrent from the traveling wave diode to the first differential TIA; and a second transmission line for transmitting the second photocurrent from the traveling wave diode to the second differential TIA.

16. The system of claim 15 wherein a characteristic impedance of the traveling wave photodiode, an impedance of the first and second transmission lines, and an impedance of the inputs to the first and second differential TIM have the same value.

17. The system of claim 15 further comprising:

A first Output Counter-Offset (OCO) circuit for receiving a differential DC output from the first differential TIA to detect any DC offset therein, wherein any DC offset in the first differential TIA output is employed as a negative feedback to the second input port of the first differential TIA to cancel the output DC offset; and a second Output Counter-Offset (OCO) circuit for receiving a differential DC output from the second differential TIA to detect any DC offset therein, wherein any DC offset in the second differential TIA output is employed as a negative feedback to the second input port of the second differential TIA to cancel the output DC offset.

18. The system of claim 17 wherein the output DC offset of the first differential TIA and the DC offset of the second differential TIA are caused by circuit unbalancing due to process-voltage-temperature variations in the TIA.

19. The system of claim 18 wherein the first and second differential TIM respectively have a first DC output and a second DC output, and wherein the respective OCOs of the first and second differential TIAs each comprises:

a first low pass filter for receiving the first DC output from the TIA;

a second low pass filter for receiving the second DC output from the TIA; and an Operational Amplifier (OPA) for receiving the first DC output from the first low pass filter and the second DC output from the second low pass filter to quantify a voltage difference, $\Delta V$, for the DC offsets to be used as a negative feedback to the second input port of the respective TIA.

20. The system of claim 19 wherein the Operational Amplifier (OPA) of each TIA has a differential output, and wherein a first OPA output is established with a negative feedback to the second input port of the respective TIA, and a second OPA output is established with a negative feedback via the respective ICO to the first input port of the respective TIA.

* * * * *